United States Patent [19]

Fletcher et al.

[11] 3,899,745

[45] Aug. 12, 1975

[54] ISOLATED OUTPUT SYSTEM FOR A CLASS D. SWITCHING-MODE AMPLIFIER

[76] Inventors: James C. Fletcher, Administrator of the National Aeronautics and Space Administration with respect to an invention of; Martial A. Honnell, Auburn, Ala.

[22] Filed: Apr. 26, 1974

[21] Appl. No.: 464,723

[52] U.S. Cl. .............................. 330/207 A; 330/24

[51] Int. Cl.[2] .............................. H03F 21/00

[58] Field of Search .......... 330/207 A, 10; 307/261, 307/262

[56] References Cited

UNITED STATES PATENTS 3,551,851 12/1970 Engel .............................. 330/10 X

*Primary Examiner*—Nathan Kaufman
*Attorney, Agent, or Firm*—George J. Porter; L. D. Woffond, Jr.; John R. Manning

[57] ABSTRACT

A Class D amplifier for the amplification of signals having uni-polar or bi-polar direct current, or alternating current, content comprising positive and negative signal channels and including a transformer-coupled output circuit for each channel which includes a switching circuit which effects isolation of the non-operating channel from the operating channel as a function of signal polarity.

5 Claims, 2 Drawing Figures

ISOLATED OUTPUT SYSTEM FOR A CLASS D. SWITCHING-MODE AMPLIFIER

ORIGIN OF THE INVENTION

The invention described herein was made in the performance of work under a NASA contract and is subject to the provisions of Section 305 of the National Aeronautics and Space Act of 1958, Public Law 85-568 (72 stat. 435; 42 U.S.C. 2457).

BACKGROUND OF THE INVENTION

1. Field of the Invention

This invention relates to Class D amplifiers, and particularly to amplifiers of this type which are adapted to amplify direct-current and alternating-current signals, and providing transformer isolation from the power supply.

2. General Description of the Prior Art

Class D amplification is a term used to describe methods of amplification which utilize switching-mode techniques. In simplest terms, the process of Class D amplification is a four-step sequence of events: (1) the input signal is sampled; (2) the information obtained is made to modulate a pulse signal; (3) the modulated pulse signal is amplified using switching-mode techniques; and (4) the amplified pulses are demodulated and filtered to recover the information contained in the input signal.

The principal advantage of Class D amplification is the high efficiency which may be attained. In previous studies, for example, Class D DC amplifiers have been designed and tested which were 80% to 90% efficient up to several hundred watts power output. Since the active devices in the power stages are operated in a saturated mode, thermal drift is insignificant. For example, saturated operation also makes it possible to reduce quiescent power consumption to levels as low as one-quarter watt in a 300-watt amplifier.

The principal disadvantage of the Class D amplifier has been the complexity of the circuitry required. A particular disadvantage has been that previous such amplifiers typically require two separate power supplies to amplify bi-polar direct-current signals. Further, due to the direct coupled nature of the circuits employed, the maximum output voltage obtained can be no greater than the supply voltage. Still another disadvantage has been that the direct-coupled amplifiers provided no isolation from the power supply.

SUMMARY OF THE INVENTION

It is the object of this invention to provide a Class D amplifier which is capable of amplifying both DC and AC signals, will provide for voltage as well as current amplification, and will provide direct current isolation between the power supply and the load. In accordance with this invention, positive and negative signal components separately modulate positive and negative signal channels with pulse width modulators. The output of each modulator is separately amplified and coupled through a transformer to a common output which includes a transistor switch and a low-pass filter which effectively demodulate the signal. The transistor switch at the output of each transformer blocks the flow of current except when the output winding of the transformer has impressed upon it an appropriately polarized signal and thus there is achieved signal isolation between the transformer outputs. Thus one output will not short out the other. This system provides direct current isolation between the power supply and the load through the use of output transformers and will amplify direct current signals of positive or negative polarity.

DETAILED DESCRIPTION OF THE DRAWINGS

Figure 1:
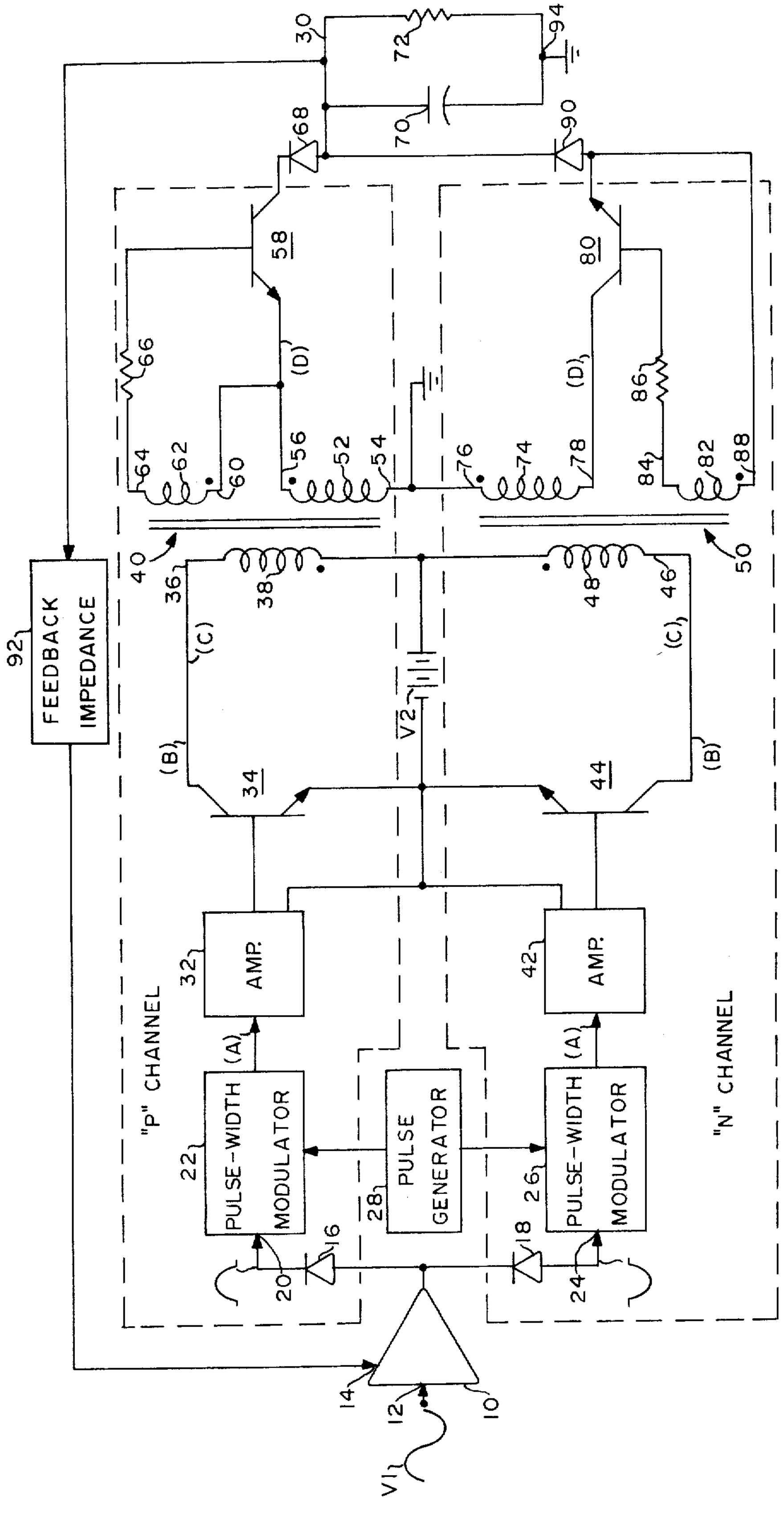
FIG. 1 is an electrical schematic illustration of an embodiment of the invention.

Referring initially to FIG. 1, input amplifier 10 is conventional, having a circuit input 12 and negative feedback input 14 and is adapted to amplify DC and AC signals. As illustrated, an AC sine wave input signal V1 is being applied to an input of amplifier 10. The amplified replica of the input signal is split by diodes 16 and 18 which are connected in an oppositely polarized manner to supply a positive portion of the signal to control input 20 of pulse width modulator 22. The negative portion is in turn coupled through oppositely polarized diode 18 to control input 24 of pulse width modulator 26. Pulse width modulators 22 and 26 are conventional, being fed a train of constant amplitude pulses from pulse generator 28 and including means for passing a duration of a pulse as a direct function of the input signal V1.

The overall amplifier circuit of this invention is divided into two channels, an upper channel hereinafter called the "P" or positive channel, and a lower channel hereinafter designated the "N" or negative channel. In accordance with the division of input signal as described, the "P" channel responds to the positive inputs and produces a negative output at circuit output 30 while the "N" channel responds to negative inputs and produces a positive output at output 30. Thus, for example, the output of modulator 22 of the "P" channel is a train of positive pulses, each pulse having a width or duration proportional to the instantaneous amplitude of a present positive input signal. Considering further the "P" channel, the pulse width modulated pulses are amplified in amplifier stage 32, and like polarity pulses are applied between the base and emitter of NPN power transistor 34. The collector of transistor 34 is connected to one lead 36 of primary winding 38 of transformer 40. The opposite lead of winding 38 is connected to the positive terminal of DC power source V2, the negative terminal of which is returned to the emitter of transformer 34.

The lower "N" channel of the amplifier circuit is essentially a mirror image of the positive channel except that negative input signals to pulse width modulator 26 are inverted within modulator 26 to produce constant amplitude, positive pulses having a width which is proportional to the amplitude of the negative input component. The output of modulator 26 of the "N" channel is coupled to amplifier stage 42 and the amplified positive output pulses are applied between the base and emitter of NPN transistor 44. The collector of transistor 44 is connected to lead 46 of primary winding 48 of transformer 50. The opposite lead of winding 48 is connected to the positive terminal of DC source V2. The negative terminal of the power source is returned to the emitter of transistor 44.

Transformers 40 and 50 each have two secondary windings. One of these, winding 52 of transformer 40, has one lead 56 connected to the emitter of NPN transistor 58. The latter lead 56 is also connected to lead 60 of winding 62 of transformer 40. The upper lead 64 of winding 62 is connected through resistor 66 to the base of transistor 58. The collector of transistor 58 is connected through diode 68, polarized to provide a negative output at output point 30, which is a junction of filter capacitor 70 and load resistor 72. Windings 52 and 62 are oppositely phased such that simultaneously a positive voltage is provided lead 56 and a negative voltage at the base of transistor 58 when a positive potential is provided on lead 56 of winding 52.

Secondary winding 74 of transformer 50 of the "N" channel has one lead 76 connected to common ground and an opposite lead 78 connected to the collector of NPN transistor 80. Secondary winding 82 of transformer 50 is connected such that one lead 84 is connected through resistor 86 to the base of transistor 80, and opposite lead 88 is connected to the emitter of transistor 80, which is further connected through diode 90 to output point 30, polarized to provide a positive output at output point 30. The lower ends of filter capacitor 70 and load resistor 72 are connected together to common ground. Secondary windings 74 and 82 are phased so as to simultaneously output a negative signal on lead 78 to the collector of NPN transistor 80, and a negative voltage on lead 84 to the base of transistor 80. A predetermined percentage of the output signal occurring across filter 70 is coupled as a negative feedback through an appropriate divider network or feedback impedance 92 to input 14 of input amplifier 10 to reduce distortion produced in the amplifier.

The outputs of the "P" and "N" channels of the amplifier are completely isolated by transformers 40 and 50 from the input signal, and, assuming that the junction of secondary windings 52 and 74 are connected to the lower junction 94 of filter 70 and load resistor 72, and both junctions disconnected from ground, the output may be completely isolated from ground.

OPERATION

Figure 2:
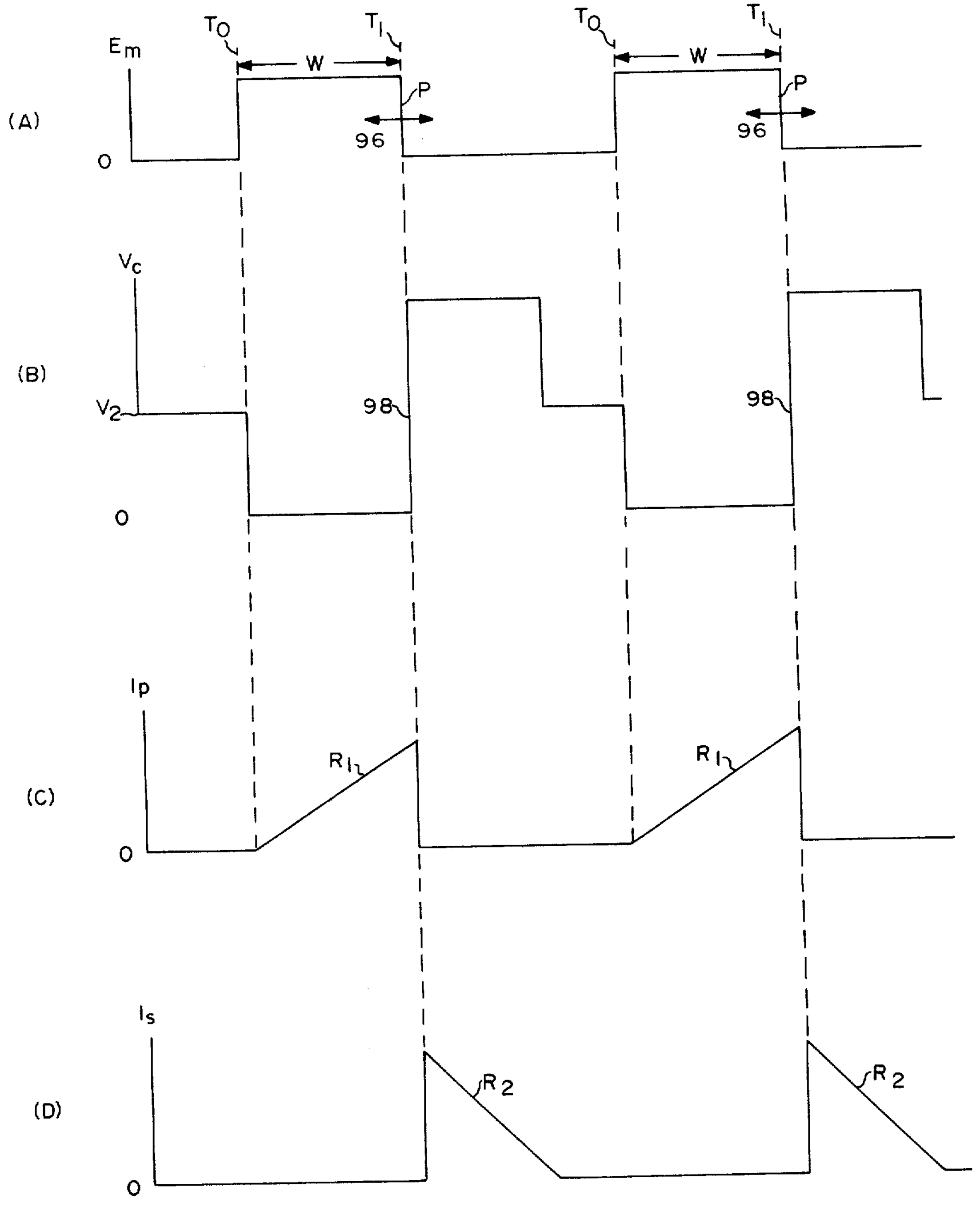
FIG. 2 consists of a series of waveforms illustrative of the operation of an embodiment of the invention shown in FIG. 1.

With no signal applied to input amplifier 10, there are zero pulse-width outputs from modulators 22 and 26, and thus no input to either of power transistors 34 and 44, with the result that transistors 34 and 44 remain cut off and no current flows in transformer 40 or 50. Such a posture is illustrated by the initial state or level of waveform A of FIG. 2, showing the output of the "P" channel modulator 22 and input to transistor 34. At the same time, it will be noted from waveform B, showing the collector voltage of transistor 34, that with no current flowing through it the collector voltage is equal to supply voltage V2. Current flow in primary winding 38 (waveform C) is also initially at a zero level as is the secondary current in winding 52 (waveform D). Since the amplifier has no output under these conditions, the inverse feedback signal at input 14 of input amplifier 10 is also zero. Next, it is assumed that the input voltage rises, as it would with the sine wave voltage V1 illustrated, to some positive value. As this occurs, the net positive signal (after subtraction of negative feedback signal as will be further explained) is amplified in amplifier 10 and fed through diode 16 to the control input of pulse-width modulator 22 of the "P" channel. The signal is blocked by diode 18 from "N" channel modulator 26. Modulator 22 then outputs a train of pulses "P" of equal amplitude at a selected rate determined by carrier pulse generator 28 with each pulse being of a duration of width "W" (waveform A) which is proportional to the instantaneous value of the input signal. Typically, the rate would be at least five times the highest frequency of the input signal and commencing at repeated constant width intervals commencing at times labelled $T_0$. These pulses are amplified by amplifier 32 and the leading edge (at time $T_0$) of each pulse drives transistor 34 into saturation reducing the collector voltage to essentially zero (waveform B) causing almost the entire voltage of power supply $V_2$ to be supplied across primary winding 38 of transformer 40. As a result, primary current in winding 38 of transformer 40 increases in a positive direction describing a ramp R. as shown in waveform C. The polarity of the voltages induced on secondary windings 62 and 52 is such that both transistor 58 and diode 68 are biased off, and as a result, no current flows through these windings. Instead, the energy represented by this current (waveform C) is stored.

At the termination of pulse P (waveformA) and the occurrence of the steep trailing edge 96 of pulse P, transistor 34 is abruptly cut off to terminate current flow in primary winding 38 at time $T_1$ (waveform C). At this point, the voltage across primary winding 38 reverses polarity in response to the change in current giving rise to the steep leading edge 98 of waveform B to a value which is the sum of $V_2$ and the voltage induced by current flow in secondary winding 52, as will be further explained. At the same instant, voltage induced in secondary windings 52 and 62 reverses, forward biasing transistor 58 into saturation and forward biasing diode 68. Accordingly, as shown in waveform D, current is induced in winding 52 and is free to flow through diode 68 and transistor 58 to filter 70 and load resistor 72, the latter representing the useful load of the amplifier circuit. As the magnetic field collapses, current flow removes the stored energy from the core of transformer 40. As shown (waveform D), this current decays in a ramp R2 of a negative slope and the period of time of decay is proportional to the duration of pulse P. The current flow through the secondary winding 52 of transformer 40 reflects a voltage across primary winding 38 of an amplitude determined by the number of turns in the secondary multiplied by the output voltage. This voltage is added to the voltage of power supply $V_2$.

It is to be noted that a positive input signal results in a negative output voltage across the output at point 30. A portion of the output voltage, as determined by feedback impedance 92 is fed as inverse feedback to input 14 of input amplifier 10 as previously explained to reduce distortion products generated in the amplifier, a conventional practice.

A similar series of events occurs during each subsequent pulse produced by pulse-width modulator 22, the pulses being of a width proportional to the instantaneous amplitude of the input signal. Thus, with a sine wave input, the pulse width increases to a maximum value and then decreases to zero when the positive half cycle ends. Concurrently, the triangular current pulses shown in waveforms C and D vary in width and amplitude.

Once the input signal reverses polarity and increases in a negative direction, a similar series of events occurs in the "N" channel of the amplifier producing a positive output of filter capacitor 70 and load 72. As the input signal goes negative, it is compared with feedback signal applied at input 14 of input stage 10 resulting in a net negative input signal. This negative input signal is then amplified as was the positive input signal, coupled from the output of input amplifier 10 through diode 18 as a control voltage to pulse-width modulator 26 of the "N" channel. The negative signal, however, is inverted within modulator 26 so as to provide equal amplitude positive pulses at a rate supplied by carrier pulse generator 28 and of a duration which is proportional to the instantaneous negative value of the input signal. These positive pulses are amplified in amplifier stage 42 and the leading edge of each pulse P drives transistor 44 into saturation. As a result, primary winding 48 of transformer 50 is connected across power supply V2 causing current flow through primary winding 48 in the same direction as was induced in primary 38 of transformer 40 of the "P" channel. This current, however, induces reverse potential in secondary windings 74 and 82 of transformer 50 to produce a negative pulse at the collector of transistor 80 and a negative pulse at the base of transistor 80, therefore cutting off transistor 80. Accordingly, no current flows in winding 74 for the duration of a current ramp (waveform C) applied to primary winding 48. Upon the termination of each driving pulse, transistor 44 is cut off. Current ceases to flow in primary winding 48 and a collapsing field reverses the voltage across primary winding 48 (waveform B). The voltages across secondary windings 74 and 82 also reverse to produce a positive voltage at the base of transistor. This turns on transistor 80 and forward biases diode 90. Accordingly, during the decay time of ramp R2 (waveform D), a positive voltage is applied to output point 30 and across filter 70 and load 72. Thus, it is to be seen that the "N" channel of the amplifier circuit functions in a similar manner to that described with respect to the "P" channel except that secondary windings 74 and 82, respectively, are connected in a reverse phase so as to recover a positive or inverted output from a negative input signal. Since there is no signal applied to the "P" channel of amplifier during the negative portion of the input signal, switching transistor 58 is in a cut-off condition. This prevents the positive pulses recovered from the "N" channel from being shorted by the secondary winding 52 of transformer 40. Transistor 80 of the "N" channel performs the same function when the "N" channel is activated by an input signal. Output filter capacitor 70 serves as a low-pass filter to remove carrier pulse components. In doing so, it averages their value and thus recreates an amplified replica of the input signal. It is to be appreciated that a more elaborate low-pass filter may be used than that illustrated.

It will be appreciated that the invention as described provides an improved form of a Class D amplifier in which alternating current signals as well as direct current signals may be amplified and wherein voltage as well as current gain may be provided.

What is claimed is:

1. A Class D amplifier comprising:

input signal means responsive to an input signal for providing a first signal output corresponding to the positive polarity content of said input signal and a second signal output corresponding to the negative polarity content of said input signal;

first and second pulse-width modulators, said first modulator being responsive to said first output for providing a chain of first output pulses wherein the width of each pulse is proportional to the instantaneous level of said first output, and said second modulator being responsive to said second output for providing a chain of second output pulses wherein the width of each pulse is proportional to the instantaneous level of said second output;

a DC power source;

a first output stage comprising:

first switching means comprising a two-terminal switched circuit responsive to the presence of a said first output pulse for presenting a closed circuit and otherwise presenting an open circuit, a first transformer comprising a primary winding and at least one secondary winding, connecting means connecting said power source in series with said primary winding and said two-terminal switched circuit, and second switching means comprising a two-terminal switched circuit in series with said secondary winding and being responsive to a discrete polarity output of said transformer for providing a first stage output from said first secondary winding of a first polarity and responsive to the release of stored energy previously supplied through said primary winding to the core of said first transformer, and otherwise said second switching means blocking current flow through said secondary winding;

a second output stage comprising:

third switching means comprising a two-terminal switched circuit responsive to the presence of a said second output pulse for presenting a closed circuit and otherwise presenting an open circuit, a second transformer comprising a primary winding and at least one secondary winding, connecting means for connecting said power source in series with said primary winding of said second transformer and said two-terminal switched circuit of said third switching means, and fourth switching means comprising a two-terminal switched circuit in series with said secondary winding of said second transformer and being responsive to a discrete polarity output of said second transformer for providing a second circuit output from said secondary winding of said second transformer of a second polarity responsive to the release of stored energy previously supplied through said primary winding of said second transformer to the core of said second transformer and otherwise said fourth switching means blocking current flow through said secondary winding of said second transformer; and filter means coupled to receive said first and second circuit outputs of said first and second output stages for eliminating pulse switching occurrences and thereby recreating an amplified replica of said input signal.

2. A Class D amplifier as set forth in claim 1 further comprising a first diode in circuit between said second switching means and said filter means polarized to pass current from said first output stage only in a first direction and a second diode in circuit between said fourth switching means and said filter means polarized to pass current only in a second direction, whereby current flow between said output stages are blocked and said output stages are isolated one from the other.

3. A Class D amplifier as set forth in claim 2 wherein each said transformer includes a second secondary winding and wherein:

said second switching circuit comprises a transistor, the collector-emitter circuit of which is connected in circuit with said first secondary transformer winding of said first transformer and the base-emitter circuit of which is connected in circuit with said second secondary winding of said first transformer; and said fourth switching means comprises a transistor, the emitter-collector circuit of which is connected in circuit with said first secondary winding of said second transformer and the base-emitter circuit of which is connected in circuit with said second secondary winding of said second transformer.

4. A Class D amplifier as set forth in claim 2 wherein said amplifier includes an electrical resistance load and said filter means comprises an electrical capacitor connected in parallel with said resistance load.

5. A Class D amplifier as set forth in claim 2 further comprising negative feedback means interconnected between said filter means and said input signal means for reducing distortion products generated within said amplifier.

* * * * *